United States Patent [19]
Vagher

[11] Patent Number: 6,021,323
[45] Date of Patent: Feb. 1, 2000

[54] DIRECT CONVERSION RECEIVER WITH REDUCED EVEN ORDER DISTORTION

[75] Inventor: Michael R. Vagher, Vinton, Iowa

[73] Assignee: Rockwell Science Center, Inc., Thousand Oaks, Calif.

[21] Appl. No.: 08/937,484

[22] Filed: Sep. 25, 1997

[51] Int. Cl.[7] ...................................................... H04Q 7/32
[52] U.S. Cl. .......................... 455/324; 455/295; 455/296; 455/311
[58] Field of Search ..................................... 455/295, 324, 455/296, 311, 313, 326, 260; 375/346; 330/258

[56] References Cited

U.S. PATENT DOCUMENTS

| Re. 31,545 | 3/1984 | Quinn | 330/149 |
|---|---|---|---|
| 4,408,352 | 10/1983 | Dudding | 455/295 |
| 4,692,712 | 9/1987 | Quinn | 330/261 |
| 4,720,685 | 1/1988 | Garuts | 330/149 |
| 4,748,420 | 5/1988 | Metz | 330/149 |
| 4,774,475 | 9/1988 | La Voie | 330/149 |
| 4,779,057 | 10/1988 | Woo | 330/149 |
| 4,804,926 | 2/1989 | Woo | 330/149 |
| 5,140,198 | 8/1992 | Atherly et al. | 327/113 |
| 5,399,988 | 3/1995 | Knierim | 330/149 |
| 5,507,036 | 4/1996 | Vagher | 455/295 |
| 5,579,347 | 11/1996 | Lindquist et al. | 375/346 |

*Primary Examiner*—Dwayne D. Bost
*Assistant Examiner*—Alan T. Gantt
*Attorney, Agent, or Firm*—Kyle Eppele; James P. O'Shaughnessy

[57] ABSTRACT

A mixer for use in a direct conversion receiver includes a compensating differential amplifier which injects equal amplitude opposite phase currents with respect to even order distortion currents. The compensating differential amplifier utilizes an ideal current source. The mixer is an active mixer which utilizes four switching transistors. The even order distortion is introduced by non-linear components which demonstrate strong off-channel signals.

20 Claims, 3 Drawing Sheets

DIRECT CONVERSION RECEIVER WITH REDUCED EVEN ORDER DISTORTION

FIELD OF INVENTION

The present invention relates to a higher frequency circuit including an even order distortion cancellation circuit. More particularly, the present invention relates to a direct conversion receiver (DCR) having reduced even order distortion.

BACKGROUND OF INVENTION

In communication applications, a direct conversion receiver (DCR) can be utilized to convert a modulated radio frequency (RF) signal to the original frequency or baseband frequency in a single step. Typically, the modulated RF signal undergoes a single frequency conversion to a "zero" intermediate frequency (IF) signal. The zero IF signal contains the modulated information.

Generally, a mixer is employed to generate the zero IF signal by mixing a local oscillator (LO) signal which is equal to the center or carrier frequency of the modulated RF signal. The mixed or zero IF signal contains the baseband frequency as well as the local oscillator frequency, the carrier frequency and the local oscillator frequency plus the carrier frequency (e.g., the modulation).

Since the local oscillator frequency is approximately the same as the RF frequency, the mixed signal contains the local oscillator frequency, two times the local oscillator frequency and the baseband frequency. A low-pass filter can be utilized to filter out the higher frequencies leaving only the baseband frequency. Thus, the direct conversion receiver directly detects or demodulates the RF signal and can more efficiently receive a baseband signal than super heterodyne receivers which often require several frequency conversions.

Direct conversion receivers often have a performance limitation related to even order distortion. For example, in high-performance receiver applications, standards require that a strong off-channel signal cannot mask a weak on-channel signal. Specifications usually require that the strong undesired signal can be up to 80 decibels (Db) greater than the weak desired signal, and yet the weaker desired signal must still be receivable without significant distortion. This requirement can cause problems in direct conversion receivers which are susceptible to even order distortion from off-channel signals.

Mixers, as well as other circuits in communication applications, typically have a non-linear transfer function that can be approximated by a power series. Even order distortion can generally be approximated by the squared power term or the second order distortion because it is usually the largest component. The squared term in the power series can cause the amplitude modulation (AM) of the RF signal to be directly converted to baseband (e.g., directly detected in a similar fashion to a diode detector).

This phenomena is separate from the desired frequency conversion of the mixer as the modulation of the strong signal is decoded to baseband (e.g., zero–IF) independently of the local oscillator frequency. Indeed, the local oscillator can actually be off and the non-linear nature of the mixer still decodes the amplitude modulation on strong off-carrier signals. Thus, in direct conversion receivers, the modulation on the strong off-channel signals can interfere with the conversion of the weak desired signal to baseband.

Thus, there is a need for a direct conversion receiver which is not susceptible to even order distortion performance limitations. Further still, there is a need for a mixer for use in a direct conversion receiver which can reduce even order distortion.

SUMMARY OF INVENTION

The present invention relates to a direct conversion receiver optimized to reduce even order distortion. The direct conversion receiver includes a signal input, an oscillator input, an output, a distortion compensation circuit and a mixing circuit. The distortion compensation circuit is coupled to the output. The distortion compensation circuit reduces the even order distortion at the output. The mixing circuit is coupled to the signal input, the oscillator input, and the output. The mixing circuit receives an input signal at the signal input and an oscillator signal at the oscillator input. The mixer signal provides a composite signal at the output.

The present invention further relates to a receiver for use in direct conversion wireless applications. The receiver includes a first signal input, a second signal input, an output, a distortion compensation circuit, and a mixing circuit. The mixing circuit is coupled to the first signal input, the second signal input, and the output. The mixing circuit receives a balanced input signal at the first signal input and an oscillator signal at the oscillator input. The mixer provides a balanced mixed signal at the output. The mixed signal includes a common-mode even order distortion current at the output. The distortion compensation circuit injects a compensation current approximately opposite to the common-mode even order distortion current at the output.

The present invention even further relates to a method of reducing even order distortion current in a direct conversion receiver. The direct conversion receiver includes an RF input, an oscillator input, a balanced output, a voltage-to-current circuit coupled to the RF input, and a mixing circuit. The mixing circuit is coupled to the voltage-to-current circuit, the oscillator input, and the balanced output. The method includes receiving an input signal with the mixer from the voltage-to-current circuit, whereby the input signal is representative of an RF signal at the RF output. The input signal includes a common-mode even order distortion current component and a balanced signal component. The method also includes mixing the input signal with an oscillator signal to form an IF signal at the balanced output, whereby the IF signal includes a common-mode even order distortion current component and a balanced signal component. Additionally, the method further includes injecting a compensation current. The compensation current is approximately opposite to the common-mode even order distortion current component at the output.

In one aspect of the present invention, a mixer for use in a direct conversion receiver is optimized to reduce even order distortion. A differential amplifier is provided at the output of the mixer to inject a compensation current which is the opposite to the even order distortion current. The even order distortion is introduced by a voltage-to-current converter (e.g., diodes or transistors), which can demodulate off-channel signals and inject the baseband signal of the off-channel signal into the desired baseband signal. The compensation circuit preferably is comprised of a differential amplifier coupled to a current mirror.

According to yet another aspect of the present invention, the voltage-to-current circuit includes a current mirror coupled to the emitters of a pair of transistors. A compensating differential amplifier configured for use with the voltage-to-current circuit is coupled between balanced outputs. A pair of transistors in the differential amplifier have emitters coupled to a current source.

In still another aspect of the present invention, a compensating differential amplifier injects opposite-phase current to the distortion current to cancel even order distortion introduced by non-linear components. The differential amplifier is configured to have the base current be the same as the base current in the voltage-to-current circuit. The mixer utilizes heterojunction bipolar transistors.

BRIEF DESCRIPTION OF THE DRAWINGS

Exemplary embodiments of the present invention will hereinafter be described with reference to the accompanying drawings, wherein like numerals denote like elements and.

DETAILED DESCRIPTION OF PREFERRED EXEMPLARY EMBODIMENTS

Figure 1:
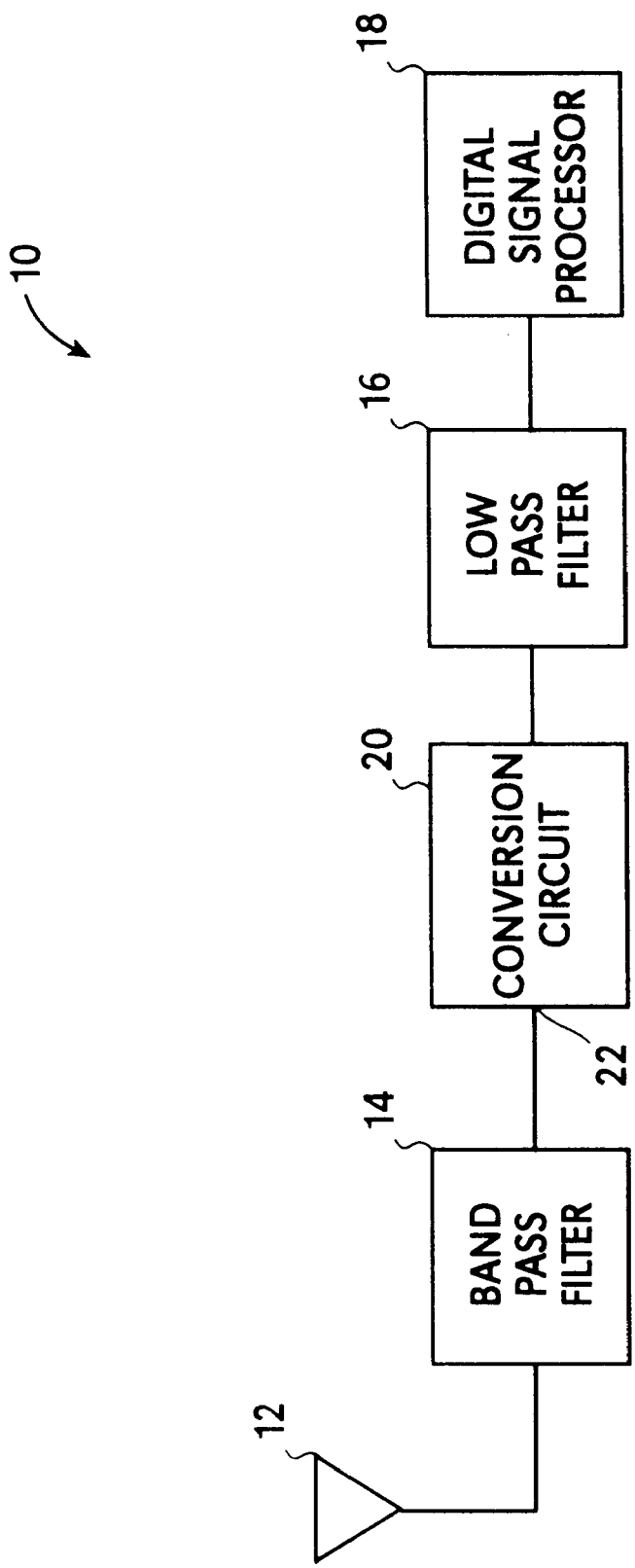
FIG. 1 is a general block diagram of a direct conversion receiver, including a conversion circuit in accordance with an exemplary embodiment of the present invention.

In FIG. 1, a direct conversion receiver (DCR) system 10 includes an antenna 12, a band-pass filter 14, a mixer or conversion circuit 20, a low-pass filter 16, and a digital signal processor 18. Radio frequency (RF) signals are received on antenna 12 and provided through a band-pass filter 14 to an input 22 of circuit 20. The RF signals are preferably modulated high frequency signals and can be ultra-high frequency (UHF), very-high frequency (VHF), or other frequency signals.

System 10 can be utilized in a variety of communication applications, including aircraft radio receivers. Circuit 20 utilizes an oscillator signal to convert the RF signal at input 22. The oscillator signal can be produced by any frequency source, such as, a voltage controlled oscillator, a direct digital synthesizer, a divider or other high frequency signal source. The oscillator signal can be in the UHF, VHF or other frequency range.

Circuit 20 provides a mixed or composite signal comprised of the local oscillator frequency, the carrier frequency of the RF signal, the local oscillator frequency plus the carrier frequency and the baseband signal. The baseband signal represents the modulation on the RF signal. Filter 16 is preferably a low-pass filter which separates or filters out the higher frequency signals from the composite signal leaving only the baseband signal. The baseband signal is provided to processor 18 for further operations in the system 10.

Conversion circuit 20 is optimized to reduce even order distortion present in the composite signal. Conversion circuit 20 preferably includes a cancellation or compensation circuit (not shown in FIG. 1) which injects a feedback signal 180 degrees out-of-phase from the even order distortion to reduce the even order distortion in the composite signal. The even order distortion can typically be represented by second order distortion which is usually the largest component of even order distortion. The even order distortion is generally introduced by non-linear components in circuit 20 which demodulate strong off-channel signals independently of the oscillator frequency.

Figure 2:
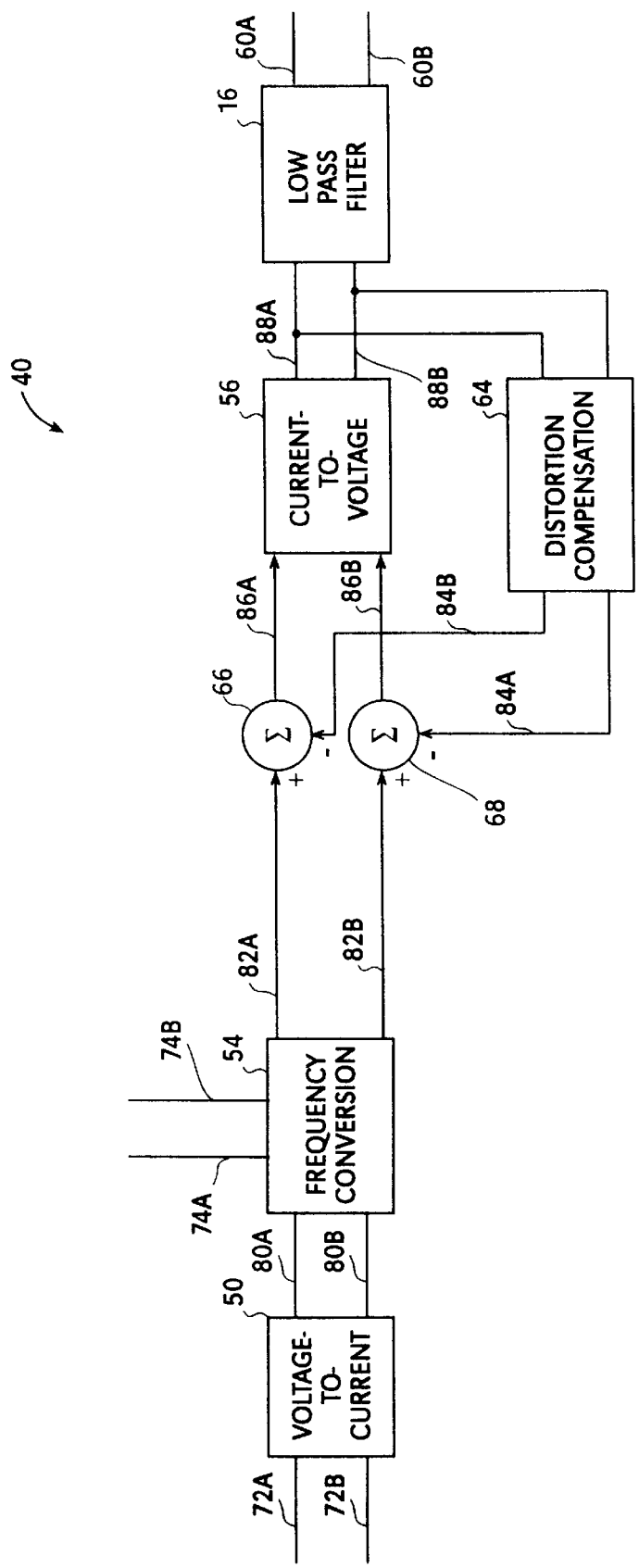
FIG. 2 is a more detailed block diagram of a mixer in accordance with another exemplary embodiment of the present invention for use in the receiver illustrated in FIG. 1.

With reference to FIG. 2, a mixing system 40 can be utilized in system 10 as conversion circuit 20. System 40 includes a voltage-to-current circuit 50, a frequency conversion circuit or mixer 54, a current-to-voltage circuit 56, a distortion compensation circuit 64, a summer 66, and a summer 68. Differential or balanced RF inputs 72A and 72B are coupled to voltage-to-current circuit 50. Balanced outputs 60A and 60B are coupled to low-pass filter 16 (as shown in FIG. 1), which is coupled to circuit 56.

Conversion circuit 54 receives an oscillator signal at balanced inputs 74A and 74B. An RF signal is provided at inputs 72A and 72B to voltage-to-current circuit 50. The RF signal is provided as a voltage differential signal to circuit 50. Circuit 50 converts the voltage differential signal to a balanced current signal that is provided on lines 80A and 80B.

Frequency conversion circuit 54 mixes the oscillator signal at inputs 74A and 74B with the RF signal on lines 80A and 80B to generate a baseband or zero IF signal at balanced lines 82A and 82B. The baseband signal at lines 82A and 82B is provided to summers 66 and 68.

Summers 66 and 68 subtract a feedback signal representative of the even order distortion from the baseband signals at lines 82A and 82B. The feedback is provided by distortion compensation circuit 64 on lines 84A and 84B. Summers 66 and 68 provide the baseband signal with reduced even order distortion on lines 86A and 86B to current-to-voltage circuit 56.

Current-to-voltage 56 provides a differential voltage baseband signal on balanced outputs 88A and 88B. Low-pass filter 16 filters the baseband signal on lines 88A and 88B and provides a filtered signal at output 68A and 68B. Distortion compensation circuit 64 receives the baseband signal on lines 88A and 88B to generate the feedback signal representative of the even order distortion on lines 84A and 84B.

For the purposes of illustration, portions of the various signals provided on lines 60A, 60B, 80A, 80B, 82A, 82B, 84A, 84B 86A, 86B, 88A, and 88B are described with reference to signal currents and distortion currents as follows. Voltage-to-current circuit 50 generates a current $Ips_{RF}$ representing the RF signal at input 72A on line 80A and a current $Ins_{RF}$ representing the RF signal at input 72B on line 80B. Additionally, voltage-to-current circuit 50 injects even order distortion due to the non-linear nature of components within circuit 50. For example, circuit 50 can include diodes or transistors which have non-linear characteristics that introduce even order distortion as is well known in the art. Therefore, circuit 50 also injects a current ($Id_{RF1}$) representing even order distortion on line 80A and a current ($Id_{RF2}$) representing even order distortion on line 80B. Preferably, current $Ips_{RF}$ and $Ins_{RF}$ are 180 degrees out-of-phase from each other while currents $Id_{RF1}$ and $Id_{RF2}$ are in-phase.

Currents $Id_{RF1}$ and $Id_{RF2}$ are almost identical. Any difference between the signal $Id_{RF1}$ on lines 80A and 80B is typically due to differences in parameters associated with the components in circuit 50. Preferably, circuit 50 includes devices which are made from a single substrate so the parameters as well as the currents $Id_{RF1}$ and $Id_{RF2}$ are almost identical. In superheterodyne applications, distortion currents $Id_{RF1}$ and $Id_{RF2}$ would be filtered out by IF band-pass filters.

Circuit 54 receives the currents $Ips_{RF}$, $Ins_{RF}$, $Id_{RF1}$ and $Id_{RF2}$ from lines 80A and 80B and generates currents $Ips_{IF}$ and $Ins_{IF}$ on lines 82A and 82B, respectively. Currents $Ips_{IF}$ and $Ins_{IF}$ represent the baseband signal of the RF signal on inputs 72A and 72B. Additionally, conversion circuit 54 allows currents associated with the even order distortion currents $Id_{RF1}$ and $Id_{RF2}$ to reach lines 82A and 82B.

Moreover, circuit 54 injects further even order distortion due to non-linear characteristics of components in circuit 54. Therefore, circuit 54 provides total even order distortion currents $Id_{IF1}$ and $Id_{IF2}$ on lines 82A and 82B, respectively. The even order distortion currents $Id_{IF1}$ and $Id_{IF2}$ are independent of the oscillator signal on lines 74A and 74B.

Summers 66 and 68 receive feedback currents $Id_{FB1}$ and $Id_{FB2}$ representative of the currents $Id_{IF1}$ and $Id_{IF2}$. Summers 66 and 68 subtract the currents $Id_{FB1}$ and $Id_{FB2}$ from currents $Ips_{IF}$, $Ins_{IF}$, $Id_{IF1}$ and $Id_{IF2}$ on lines 82A and 82B. Therefore, summers 66 and 68 provide current $Ips_{IF}$ at line 86A and current $Ins_{IF}$ at line 86B, (e.g., assuming the sum of currents $Id_{IF1}$ and $Id_{IF2}$ and the sum of currents $Id_{FB1}$ and $Id_{FB2}$ are essentially equal). Circuit 56 converts the currents $Ips_{IF}$ and $Ins_{IF}$ at lines 86A and 86B to a differential voltage signal that is filtered by filter 16 and is provided at outputs 60A and 60B. Distortion compensation circuit 64 receives the voltage signal at lines 88A and 88B and responds to the voltage signal to generate the feedback currents $Id_{FB1}$ and $Id_{FB2}$ on lines 84A and 84B.

Figure 3:
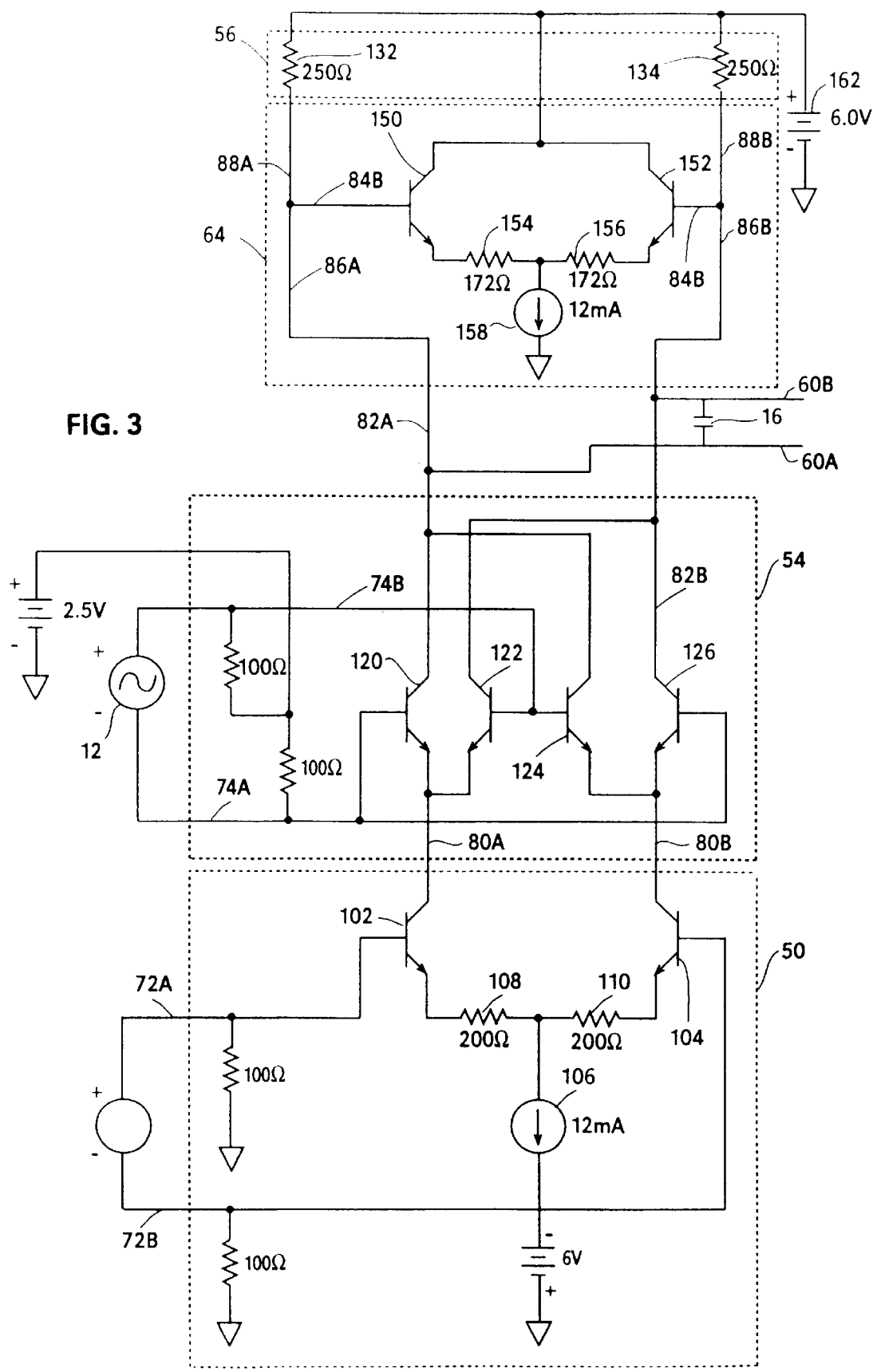
FIG. 3 is an electrical schematic diagram of the mixer illustrated in FIG. 2.

With reference to FIG. 3, a more detailed schematic diagram of system 40 includes reference numerals similar to numerals of FIG. 2. In FIG. 3, lines 60A, 60B, 82A, 82B, 84A, 84B, 86A, 88A and 88B are electrically equivalent. The RF signal is provided at inputs 72A and 72B to voltage-to-current circuit 50. Circuit 50 is comprised of a transistor 102, a transistor 104, a current source 106, a resistor 108, and a resistor 110. Transistors 102 and 104 are preferably NPN heterojunction transistors arranged as a differential amplifier, with resistors 108 and 110 arranged as emitter feedback resistors which are coupled to current source 106. Current source 106 is preferably an ideal current source or as close to an ideal current source as possible.

Transistors 102 and 104 can inject even order distortion on lines 80A and 80B. The even order distortion is common-mode distortion which will travel through mixer 54 unaffected as currents $Id_{RF1}$ and $Id_{RF2}$. As discussed with reference to FIG. 2, circuit 50 provides currents $Ips_{RF}$ and $Id_{RF1}$ at line 80A and currents $Ins_{RF}$ and $Id_{RF2}$ at line 80B.

Mixer 54 is an active mixer comprised of a transistor 120, a transistor 122, a transistor 124, and a transistor 126. Transistors 120, 122, 124, and 126 are preferably NPN heterojunction transistors. Transistors 120 and 122 have emitters coupled to line 80A, and transistors 124 and 126 have emitters coupled to line 80B. The bases of transistors 122 and 124 are coupled to input 74B and the bases of transistors 120 and 126 are coupled to input 74A. The collectors of transistors 120 and 124 are coupled to line 86A, and the collectors of transistors 122 and 126 are coupled to line 86B.

Mixer 54 operates as a biphase switch or switching quad for mixing signals in a current mode. The oscillator signal at inputs 74A and 74B drive the bases of transistors 120, 122, 124, and 126 which operate as an active mixer. The cross-coupling of the collectors of transistors 120, 122, 124, and 126 creates a 180 degree phase shift between the signals on lines 86A and 86B.

Circuit 56 includes a load resistor 132 and a load resistor 134. Load resistor 132 is coupled to the collectors of transistors 120 and 124, and load resistor 134 is coupled to the collectors of transistors 122 and 126.

Distortion compensation circuit 64 is coupled between circuit 56 and circuit 54 at lines 86A and 86B. Circuit 64 includes a transistor 150 and a transistor 152. Transistors 150 and 152 are preferably heterojunction transistors similar to transistors 102 and 104 of circuit 50. The collectors of transistors 150 and 152 are coupled to a power source 162. A base of transistor 150 is coupled to line 86A, and a base of transistor 152 is coupled to line 86B. An emitter of transistor 150 is coupled to an emitter resistor 154 and an emitter of transistor 152 is coupled to an emitter resistor 156. Resistors 154 and 156 are also coupled to an ideal current source 158.

The operation of system 40 with particular details related to circuit 50 and circuit 64 are discussed in detail below. Even order distortion enters system 40 through transistors 102 and 104 of circuit 50. The distortion currents $Id_{RF1}$ and $Id_{RF2}$ travel through the collectors of transistors 102 and 104 and exit through the bases of transistors 102 and 104. There is no distortion current at the emitters of transistors 102 and 104 due to the operation of current source 106. Current source 106 ensures that the combination of the emitter currents is always approximately 12.0 mA or other constant current value.

The $Ips_{RF}$ current in line 80A travels through transistor 102 across resistor 108 and into source 106. Similarly, the $Ins_{RF}$ current travels through transistor 104 across resistor 110 and into source 106. The $Isp_{RF}$ and $Isn_{RF}$ currents are 180 degrees out-of-phase so changes in one current offset changes in the other current. Therefore, a constant current is provided to source 106.

Since source 106 maintains a constant current, the distortion currents $Id_{RF1}$ and $Id_{RF2}$ cannot be provided through the emitters of transistors 102 and 104. Therefore, the distortion currents $Id_{RF1}$ and $Id_{RF2}$ must exit the bases of transistors 102 and 104.

The distortion currents $Id_{RF1}$ and $Id_{RF2}$ are common-mode and in-phase with each other. By subtracting the signals at 80A and 80B, two times the signal current could be provided, and the distortion current would be subtracted out. However, in typical applications, the subtraction does not eliminate enough even order distortion for satisfactory operation according to specifications, such as, the 30 Db requirement for off-channel communications.

As stated above, the distortion currents $Id_{RF1}$ and $Id_{RF2}$ travel through circuit 54 essentially unaffected. The $Isp_{RF}$ and $Ins_{RF}$ currents are converted to baseband currents $Isn_{IF}$ and $Isp_{RF}$ at lines 82A and 82B. The distortion currents $Id_{IF1}$ and $Id_{IF2}$ on lines 82A and 82B are the combination of currents $Id_{RF1}$ and $Id_{RF2}$ and the distortion current created by circuit 54.

Circuit 64 is configured similarly to circuit 50, with a current source coupled to a differential amplifier. Transistors 150 and 152 form the differential amplifier. Matching distortion or feedback currents $Id_{FB1}$ and $Id_{FB2}$ are injected from the bases of transistors 150 and 152 to lines 86A and 86B. The feedback currents $Id_{FB1}$ and $Id_{FB2}$ are provided through the collectors of transistors 150 and 152 to power supply 162. Feedback currents $Id_{FB1}$ and $Id_{FB2}$ cannot flow through emitters 150 and 152 since the operation of current source 158 is similar to the operation of circuit 150. Thus, circuit 54 operates to remove distortion currents $Id_{IF1}$ and $Id_{IF2}$ from lines 86A and 86B by injecting currents $Id_{FB1}$ and $Id_{FB2}$.

Circuit 64 is similar to circuit 50 and is configured to have the same distortion base currents or feedback currents $Id_{FB1}$ and $Id_{FB2}$ in transistors 150 and 152 as the distortion or currents $Id_{RF1}$ and $Id_{RF2}$ in the bases of transistors 102 and 104. More particularly, resistors 154 and 156 must be selected so that the base currents are equal in transistors 150 and 152 to the base currents in transistors 102 and 104. Various design criteria can change for the selection of values in system 40. For example, the emitter feedback resistors, the bias current and the transistor size for any of these devices may affect selection of devices for system 40.

Exemplary values for resistors 108 and 110 are 200 ohms and for resistors 154 and 156 are 172 ohms. A value of 172 ohms is chosen rather than an initial estimate of 160 ohms for resistors 154 and 156 due to non-linear factors associated with mixer 54. The gain of system 40 is preferably about 1.25.

Bias current for transistors 102 and 104 can be selected somewhat arbitrarily. A smaller bias current requires larger emitter resistors. Current sources 106 and 158 preferably sink 12 MA of current. The oscillator signal on inputs 74A and 74B is preferably a sinusoidal oscillator signal having a frequency of 4.11 MHz. The RF signal preferably is a 1 MHz-carrier having a 100 KHz sine wave modulation. Generally, system 40 can provide a 10 Db to 15 Db reduction of even order distortion.

The method and apparatus described herein can improve the reduction of common-mode distortion in balanced amplifiers and mixers. The system utilizes resistors and transistors which are matched. The matching can achieve a high level of precision by utilizing integrated circuitry. The matching is inherently broad-band since reactive matching is not used. Furthermore, the matching is especially broad-band in mixer applications since the distortion of interest is at baseband frequency. The distortion being canceled on lines 86A and 86B is preferably at baseband frequency and is independent of the oscillator signal as mentioned above. The baseband or low frequency associated with the distortion reduces the need for proper phasing for cancellation because expected delays on the order of nanoseconds translate to negligible phase shift at baseband frequencies (e.g., baseband assumed to be less than 100 kHz).

System 40 can easily be modified for use as a differential amplifier. Removing circuit or mixer 54 in FIG. 3 results in a differential amplifier circuit with reduced even order distortion.

The common-mode distortion currents, such as, $Id_{RF1}$ and $Id_{RF2}$ can also be viewed as a variation in the bias level of the differential amplifier (e.g., transistors 102 and 104 of circuit 50). Current source 106 does not permit variations in the emitter current. Therefore, no even order distortion can occur in the emitter current even though even order distortion occurs in the collector current. The emitter current is the sum of the base current and the collector current (e.g., $I_e = i_b + i_c$) and, therefore, the distortion current can only exist in the base current and the collector current. In fact, the distortion current exists in equal amounts in the base and in the collector and is opposite in-phase because the emitter current must remain constant. With a non ideal current source, some common-mode distortion can appear in the midcurrent. However, if the impedance of current source 106 is made sufficiently high, current source 106 can be treated as ideal for a first approximation. Typically, current sources, such as, source 106 are comprised of heterojunction bipolar transistors which have very high output impedances.

While exemplary embodiments for the present invention have been shown, it should be apparent to those of skill in the art that what has been described is considered to be a preferred embodiment of a mixer. Various changes can be made without departing from the scope of the present invention as defined in the following claims. For example, although a mixer is shown, the compensation circuit could be utilized in a differential amplifier or other device for use in communication systems. Further still, although particular component values and transistors are utilized, other electrical devices can be used to provide the appropriate compensation current. The appended claims are intended to cover all such changes and modifications which fall within the scope of the invention.

What is claimed is:

1. A direct conversion receiver optimized to reduce even order distortion, the direct conversion receiver comprising:
   a signal input;
   a voltage-to-current circuit coupled to the signal input;
   an oscillator input;
   an output;
   a distortion compensation circuit coupled to said output, the distortion compensation circuit reducing the even order distortion at the output; and
   a mixing circuit coupled to the voltage-to-current circuit, the oscillator input, and the output, the mixing circuit receiving an input signal from the voltage-to-current circuit and an oscillator signal at the oscillator input, the mixer providing a composite signal at the output;
   wherein the voltage-to-current circuit injects common mode distortion and the distortion compensation circuit has a matched circuit to remove the common mode distortion.

2. The direct conversion receiver of claim 1 further comprising:
   a voltage-to-current circuit coupled between the mixing circuit and the signal input.

3. A direct conversion receiver optimized to reduce even order distortion, the direct conversion receiver comprising:
   a signal input:
   an oscillator input;
   an output;
   a distortion compensation circuit coupled to said output, the distortion compensation circuit reducing the even order distortion at the output; and
   a mixing circuit coupled to the oscillator input, and the output, the mixing circuit receiving an input signal from the signal input and an oscillator signal at the oscillator input, the mixer providing a composite signal at the output;
   a voltage-to-current circuit coupled between the mixing circuit and the signal input;
   wherein the voltage-to-current circuit includes a first pair of transistors coupled to a first current mirror, and wherein the distortion compensation circuit includes a second pair of transistors coupled to a second current mirror, wherein the first pair of transistors introduce the second order distortion, and the second pair of transistors are configured to remove the second order distortion at the output.

4. The direct conversion receiver of claim 3, wherein the first and second pairs of transistors are heterodyne bipolar transistors.

5. The direct conversion receiver of claim 4, wherein emitters of the first pair of transistors are coupled to the first current mirror, and emitters of the second pair of transistors are coupled to the second current mirror.

6. The direct conversion receiver of claim 5, wherein bases of the first pair of transistors are coupled to the signal input, and bases of the second pair of transistors are coupled to the output.

7. A receiver for use in direct conversion wireless applications, the receiver comprising:

a voltage-to-current converter;

a first signal input coupled to the voltage-to-current converter;

a second signal input;

an output;

a distortion compensation circuit coupled to the output; and a mixing circuit coupled to the first signal input, the second signal input, and the output, the mixing circuit receiving a balanced input signal at the first signal input and an oscillator signal at the oscillator input, the mixer providing a balanced mixed signal at the output, the mixed signal including a common-mode even order distortion current from the voltage-to-current converter, wherein the distortion compensation circuit injects a compensation current approximately opposite to the common-mode even order distortion current at the output via circuitry matched to the voltage-to-current converter.

8. The receiver of claim 7, wherein the distortion compensation circuit includes a differential amplifier coupled to the output.

9. The receiver of claim 8, wherein the distortion compensation circuit includes a pair of transistors coupled to a current mirror.

10. The receiver of claim 9, wherein the common-mode even order distortion current is introduced by a voltage-to-current circuit coupled between an RF input and a first signal input.

11. A receiver for use in direct conversion wireless applications, the receiver comprising:

a first signal input;

a second signal input;

an output;

a distortion compensation circuit; and a mixing circuit coupled to the first signal input, the second signal input, and the output, the mixing circuit receiving a balanced input signal at the first signal input and an oscillator signal at the oscillator input, the mixer providing a balanced mixed signal at the output, the mixed signal including a common-mode even order distortion current at the output, wherein the distortion compensation circuit injects a compensation current approximately opposite to the common-mode even order distortion current at the output;

wherein the distortion compensation circuit includes a differential amplifier coupled to the output;

wherein emitters of the pair of transistors are coupled to the current mirror, and bases of the second pair of transistors are coupled to the output.

12. The receiver of claim 7, wherein the oscillator signal is approximately the same frequency as the balanced input signal.

13. The receiver of claim 7, wherein the mixing circuit includes four transistors.

14. The receiver of claim 7, wherein the even order distortion includes second order distortion.

15. A method of reducing even order distortion current in a direct conversion receiver, the direct conversion receiver including an RF input, an oscillator input, a balanced output, a voltage-to-current circuit coupled to the RF input, a mixing circuit coupled to the voltage-to-current circuit, the oscillator input, and the balanced output, the method comprising:

receiving an input signal with the mixer from the voltage-to-current circuit, the input signal being representative of an RF signal at the RF input, the input signal including a common-mode even order distortion current component and a balanced signal component;

mixing the input signal with an oscillator signal to form an IF signal at the balanced output, the IF signal including a common-mode even order distortion current component and a balanced signal component; and injecting a compensation current approximately opposite to the common-mode even order distortion current component at the output, the compensation current being injected by a compensation circuit matched to the voltage-to-current circuit.

16. The method of claim 15, wherein the injecting step is performed by a distortion compensation circuit including a differential amplifier coupled to the output.

17. The method of claim 8, wherein the distortion compensation circuit includes a pair of transistors coupled to a current mirror.

18. The method of claim 17, wherein the IF signal is a baseband signal.

19. The method of claim 15, wherein the voltage-to-current circuit is a transistor a diode circuit.

20. The method of claim 15, wherein the even order distortion includes second order distortion.

* * * * *